(12) United States Patent
Ahn et al.

(10) Patent No.: US 6,846,751 B2
(45) Date of Patent: Jan. 25, 2005

(54) NITROGEN IMPLEMENTATION TO MINIMIZE DEVICE VARIATION

(75) Inventors: Jae-Gyung Ahn, Pleasanton, CA (US); Young T. Woo, Portland, OR (US)

(73) Assignee: Integrated Device Technology, Inc., Santa Clara, CA (US)

( * ) Notice: Subject to any disclaimer, the term of this patent is extended or adjusted under 35 U.S.C. 154(b) by 276 days.

(21) Appl. No.: 10/318,989

(22) Filed: Dec. 13, 2002

(65) Prior Publication Data

US 2004/0113182 A1 Jun. 17, 2004

(51) Int. Cl.⁷ .............................................. H01L 21/31
(52) U.S. Cl. ..................................... 438/769; 438/197
(58) Field of Search ................................ 438/197, 769

(56) References Cited

PUBLICATIONS

"Nitrous oxide ($N_2O$) processing for silicon oxynitride gate dielectrics"; K.A. Ellis and R.A. Buhrman; IBM J. Res. Develop. vol. 43 No. 3, May, 1999; pp. 287–300.

*Primary Examiner*—Long Pham
(74) *Attorney, Agent, or Firm*—Bever, Hoffman & Harms, LLP

(57) ABSTRACT

A rapid thermal nitridation (RTN) process produces a nitrogen concentration gradient in an oxynitride layer to compensate for transistor threshold voltage effects from a thickness gradient in the oxynitride layer. The nitrogen concentration gradient is selected to allow greater dopant penetration through thicker gate dielectrics in PMOS transistors formed using the oxynitride layer. Any increases in threshold voltage due to thicker gate dielectrics are counteracted by corresponding decreases in threshold voltage due to dopant penetration, allowing consistent threshold voltage values to be maintained for all PMOS transistors on a single wafer. The nitrogen concentration gradient can be introduced by regulating the flow of nitrous oxide during RTN processing to cause an accumulation of atomic oxygen to develop within the process chamber. The atomic oxygen forms a concentration distribution that increases in the direction of nitrous oxide flow, and therefore removes incorporated nitrogen from the oxynitride layer in corresponding proportions.

6 Claims, 9 Drawing Sheets

NITROGEN IMPLEMENTATION TO MINIMIZE DEVICE VARIATION

BACKGROUND OF THE INVENTION

1. Field of the Invention

The present invention relates to the area of semiconductor processing. In particular, the present invention relates to a method for minimizing device variation across a wafer by adjusting oxynitride layer nitrogen concentration during rapid thermal nitridation.

2. Discussion of Related Art

The dimensions of modern semiconductor devices are continually being reduced to improve integrated circuit (IC) capabilities while increasing speed and decreasing power consumption. To accommodate this continual trend towards greater miniaturization, the semiconductor processes used in the production of ICs are constantly being refined. One area of critical importance is the formation of the gate dielectrics in metal-oxide-semiconductor (MOS) transistors—in particular the gate dielectrics of PMOS transistors. Historically, silicon dioxide ($SiO_2$) has been the material of choice for PMOS transistor gate dielectrics. However, as the thickness of an $SiO_2$ gate dielectric is reduced, P-type dopant atoms (e.g., boron) from the overlying polysilicon gate can penetrate the gate dielectric and lodge in the channel region of the transistor. This "dopant penetration" results in an undesirable reduction in transistor threshold voltage (Vt). To address this problem, the ultrathin gate dielectrics of modern PMOS transistors are often formed from oxynitrides ($SiO_xN_y$ or nitrogen-doped $SiO_2$). The nitrogen incorporated into such layers tends to prevent dopant penetration.

A rapid thermal nitridation (RTN) process is often used to form oxynitride gate dielectrics. In an RTN process, a wafer is subjected to high temperature heating while nitrous oxide and oxygen flow across the wafer surface. FIG. 1 shows a conventional RTN process chamber 100, which is substantially similar to the Heatpulse 8108 tool from AG Associates, Inc., a subsidiary of Metron Technology, 1350 Old Bayshore Highway, Suite 210, Burlingame, Calif. 94010. RTN chamber 100 comprises a quartz isolation tube 110 that includes a gas inlet port 111 and a gas outlet port 112. RTN chamber 100 further includes a set of upper tungsten halogen lamps 120a positioned above quartz isolation tube 110, and a set of lower tungsten halogen lamps 120b positioned below quartz isolation tube 110, all of which are enclosed by a plated heating chamber 130.

To form an oxynitride layer on a wafer 190 placed in isolation tube 110, power is provided to upper tungsten halogen lamps 120a and lower tungsten halogen lamps 120b while nitrous oxide ($N_2O$) and oxygen ($O_2$) flow from gas inlet port 111 to gas outlet port 112. The edge of wafer 190 closest to gas inlet port 111 is designated the "leading edge" of the wafer, while the edge of wafer 190 closest to gas outlet port 112 is designated the "trailing edge." Note that although a wafer is generally round, wafer "edges" can be defined as indicated based on a profile view of the wafer. The leading edge and trailing edge can therefore be considered substantially opposing edges of wafer 190, as they capture the entire width (i.e., diameter) of wafer 190.

The radiant heat from lamps 120a and 120b raises the temperature of wafer 190 and also heats the nitrous oxide as it flows from the leading edge to the trailing edge of wafer 190. As described by Ellis et al. in "Nitrous Oxide ($N_2O$) Processing for Silicon Oxynitride Gate Dielectrics" (IBM J. Res. Develop., Vol. 43, No. 3, May 1999) (hereinafter "Ellis"), the nitrous oxide molecules decompose in this high temperature environment into nitrogen gas ($N_2$) and atomic oxygen (O). This oxygen release reaction can be described by the following equation:

$$N_2O \rightarrow N_2 + O \qquad (1)$$

The highly reactive oxygen radical liberated by this mechanism can then react with another nitrous oxide molecule to form nitric oxide (NO), as described by the following equation:

$$N_2O + O \rightarrow 2NO \qquad (2)$$

The nitric oxide then reacts with the heated surface of wafer 190 to form an oxynitride layer. Ideally, the oxynitride layer would have a constant thickness to ensure performance consistency of later-formed devices. Unfortunately, conventional RTN chambers produce oxynitride layers having thicknesses that increase in the process gas (i.e., $N_2O$) flow direction. For example, FIG. 2a shows a processed wafer 200 that includes an example oxynitride layer 191 formed on wafer 190 using a conventional RTN process. The thickness Tn of oxynitride layer 191 increases from a minimum thickness Tn1 at the leading edge of wafer 190 to a maximum thickness Tn2 at the trailing edge of wafer 190 (not to scale). This oxynitride thickness gradient is caused by a process temperature gradient that is typically present within conventional RTN process chambers. This thermal gradient exists because the nitrous oxide is constantly being heated as it flows across the surface of the wafer. Therefore, in addition to radiant heating, the downstream portions of the wafer receive additional convective heating that leads to higher temperatures.

FIG. 2b shows an example graph of process temperature TEMP for a typical RTN process, charted against the thickness Tn of an oxynitride layer formed by such a temperature profile. Process temperature TEMP rises from a minimum temperature Temp1 at the leading edge of wafer 190 to a maximum process temperature Temp2 at the trailing edge of wafer 190. The profile of process temperature TEMP can therefore be designated as having a "positive" gradient—i.e., increasing from the leading edge of the wafer to the trailing edge. Because the nitridation process rate is directly affected by process temperature, oxynitride layer thickness Tn tracks process temperature TEMP in a linear fashion. Therefore, the oxynitride layer thickness also exhibits a positive gradient. The specific thickness gradient depends on the particular process technology in which the oxynitride layer is to be used. For example, the thickness of an oxynitride layer for a 0.25 um process can increase from 4.8 nm to 6 nm, while a similar layer for a 0.13 um process can exhibit a thickness range from 1.8 nm to 2.4 nm.

A non-uniform oxynitride layer thickness is problematic because transistors formed on such a layer will exhibit a corresponding variation in gate dielectric thickness. FIG. 3a shows a processed wafer 300 formed from processed wafer 200 shown in FIG. 2a. Processed wafer 300 includes PMOS transistors 310a, 310b, 310c, and 310d. Transistors 310a–310d comprise source regions 312a–312d, respectively, drain regions 313a–313d, respectively, gates 311a–311d, respectively, and gate dielectrics 191a–191d, respectively. Gate dielectrics 191a–191d have thicknesses Toxa–Toxd, respectively, which are formed from oxynitride layer 191 shown in FIG. 2a. Accordingly, thicknesses Toxa–Toxd track the thickness profile of oxynitride layer 191; i.e., the gate dielectric of a transistor formed towards the trailing edge of wafer 190 (e.g., transistor 310d) will be thicker than the gate dielectric of a transistor formed towards the leading edge of wafer 190 (e.g., transistor 310*a*).

This variation in gate dielectric thickness from transistor to transistor is undesirable because it causes the each of transistors 310*a*–310*d* to have a different threshold voltage. FIG. 3*b* shows a graph of gate dielectric thickness for transistors 310*a*–310*d* shown in FIG. 3*a*, while FIG. 3*c* shows a corresponding graph of threshold voltage for transistors 310*a*–310*d*. Because the threshold voltage of a PMOS transistor is directly proportional to its gate dielectric thickness, threshold voltages Vta–Vtd of transistors 310*a*–310*d*, respectively, exhibit a linear correlation with gate dielectric thicknesses Toxa–Toxd, respectively.

Thus, the non-constant thickness of an oxynitride layer produced by a conventional RTN process can have a significant effect on the performance of subsequently formed devices. For example, in a 0.25 um process where gate dielectric thickness can vary up to 25% across the wafer, threshold voltage Vtd of transistor 310*d* could be 25% greater than threshold voltage Vta of transistor 310*a*. This in turn can lead to reduced yield and/or increased production costs as process parameters are tightened to compensate for this threshold voltage variation. Accordingly, it is desirable to provide a method for producing an oxynitride layer such that transistors formed using the oxynitride layer have a consistent threshold voltage regardless of their position across the surface of the wafer on which the oxynitride layer is formed.

SUMMARY

The invention provides a method for creating an oxynitride layer having constant threshold voltage characteristics. By introducing a nitrogen concentration gradient into the oxynitride layer, the threshold voltage variations that would normally be introduced by a thickness gradient in the oxynitride layer can be minimized.

As mentioned previously, nitrogen is introduced into the gate dielectric of a transistor to prevent dopant penetration from the heavily doped gate (typically polysilicon) into the channel region of the transistor. The greater the nitrogen concentration in the gate dielectric, the less dopant penetration that can take place. Because dopant penetration reduces transistor threshold voltage, conventional RTN processes are generally configured to produce oxynitride layers having a constant nitrogen concentration, thereby eliminating dopant penetration as a potential source of transistor performance variation.

In contrast, the invention purposely introduces a negative nitrogen concentration gradient (i.e., decreasing from the leading edge of the wafer to the trailing edge) into the oxynitride layer during RTN processing. The transistors formed from such an oxynitride layer then experience a greater degree of dopant penetration as their position approaches the trailing edge of the wafer. By properly sizing the nitrogen concentration gradient formed during the RTN process, this increasing dopant penetration (and associated threshold voltage reduction) can partially or fully compensate for increases in threshold voltage caused by the increased gate dielectric thicknesses of transistors located closer to the trailing edge of the wafer.

A nitrogen concentration gradient can be formed in an oxynitride layer via appropriate process parameter specifications in the RTN recipe. A recipe in accordance with an embodiment of the invention produces a nitrogen gradient in an oxynitride layer by reducing the flow rate of nitrous oxide through the process chamber during the RTN process. It has been observed (for example, in Ellis, p. 298) that atomic oxygen can react with and remove nitrogen that has previously been incorporated into an oxynitride layer. Therefore, conventional RTN recipes specify a high nitrous oxide flow rate to ensure that any excess oxygen radicals (i.e., atomic oxygen not consumed by the processes involved in the formation of the oxynitride layer) are rapidly exhausted from the process chamber. Contrastingly, a recipe in accordance with the invention purposely allows those excess oxygen radicals to accumulate within the process chamber by reducing the nitrous oxide flow rate. Because atomic oxygen is being formed across the surface of the wafer during the RTN process, the excess oxygen radicals naturally form a concentration gradient that increases in the direction of nitrous oxide gas flow. Therefore, the closer a particular location in the oxynitride layer is to the trailing edge of the wafer, the higher the local concentration of atomic oxygen and the more nitrogen is removed from that portion of the oxynitride layer. In this manner, a negative nitrogen concentration gradient is formed in the oxynitride layer. By adjusting the nitrous oxide flow rate, a desired nitrogen concentration gradient (slope) can be achieved to compensate for the effect on threshold voltage created by the oxynitride layer thickness gradient.

The present invention will be more fully understood in view of the following description and drawings.

DETAILED DESCRIPTION

Figure 4:
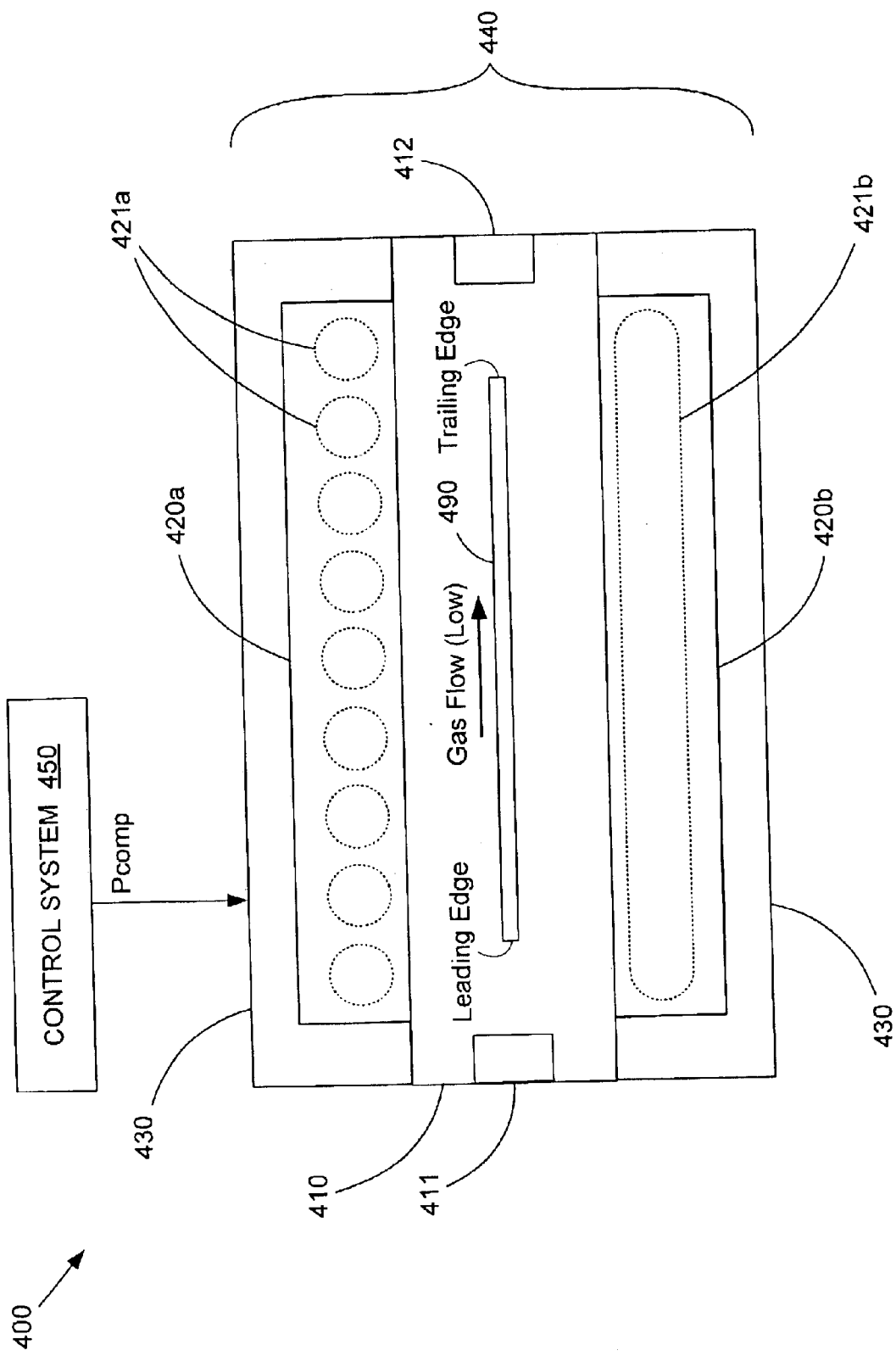
FIG. 4 is a schematic diagram of an RTN system incorporating a recipe in accordance with an embodiment of the invention.

The invention provides a method for ensuring consistent PMOS transistor performance across a processed wafer when an RTN process is used in the formation of the PMOS transistor gate dielectrics. By introducing a nitrogen concentration gradient into the oxynitride layer formed during the RTN process, effects on threshold voltage caused by a thickness gradient in the oxynitride layer can be minimized. FIG. 4 shows an RTN system 400 configured to create a nitrogen concentration gradient in an oxynitride layer. RTN system 400 comprises a control system 450 that provides a PMOS compensation recipe Pcomp to an RTN process chamber 440. RTN process chamber 440 comprises a quartz isolation tube 410 that includes a gas inlet port 411 and a gas outlet port 412. RTN process chamber 440 further includes heat sources 420a and 420b, which can comprise any means for heating a semiconductor (e.g., silicon) wafer 490 in isolation tube 410. For example, optional tungsten halogen lamps 421a and 421b can be used by heat sources 420a and 420b, respectively, to radiantly heat wafer 490. Finally, RTN process chamber 440 is enclosed in a heating chamber body 430.

Figure 1:
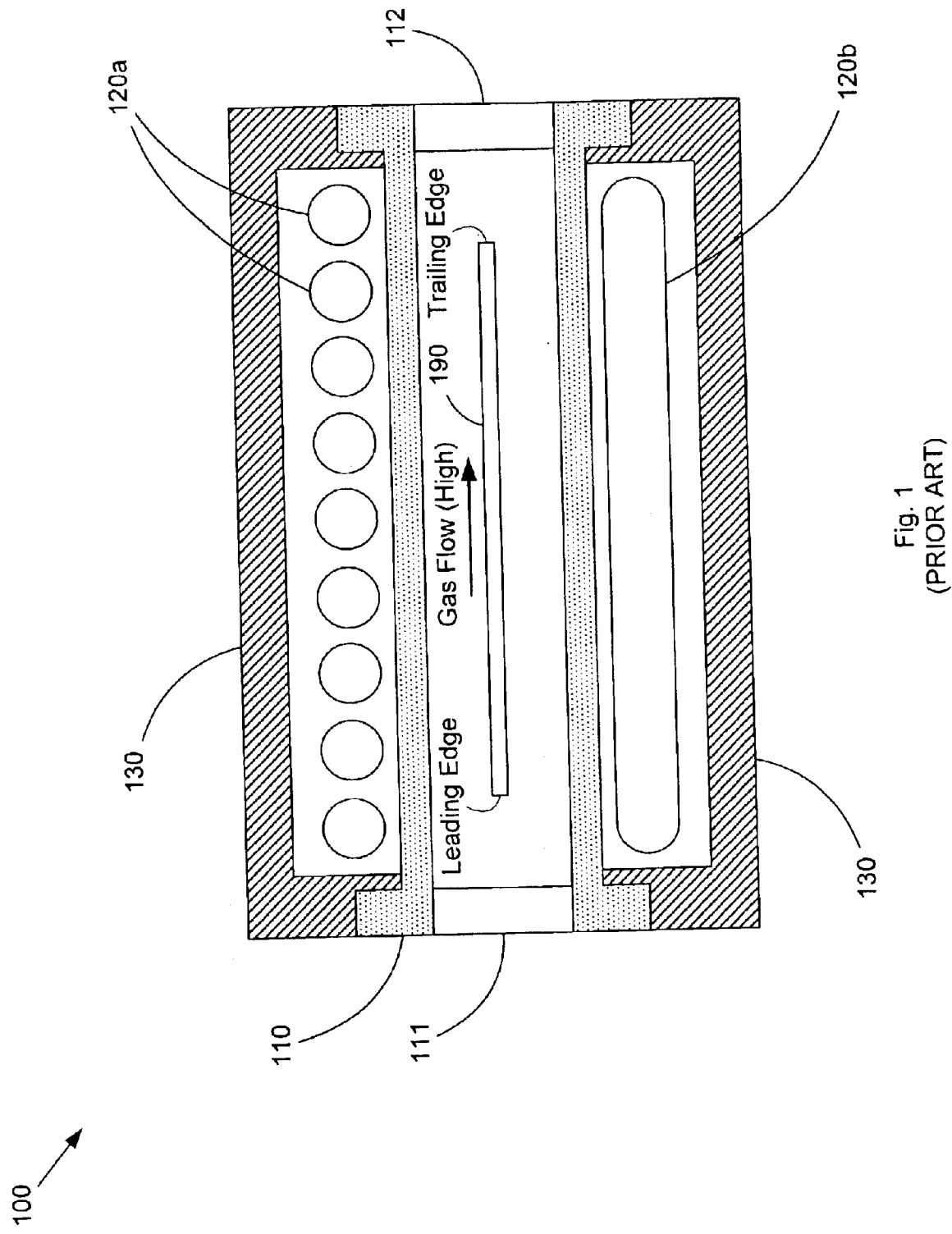
FIG. 1 is a schematic diagram of a conventional RTN process chamber.

Using the same convention applied to FIG. 1, the edge of wafer 490 closest to gas inlet port 411 (i.e., the edge facing into the process gas flow during nitridation) is designated the "leading edge" of the wafer, while the edge of wafer 490 closest to gas outlet port 412 (i.e., the edge facing away from the $N_2O$ gas flow) is designated the "trailing edge." All subsequent usage of the terms "leading edge" and "trailing edge" will refer to this nitridation gas flow frame of reference. To perform an RTN operation, a wafer 490 is placed in isolation tube 410 and heated by heat sources 420a and 420b while nitrous oxide ($N_2O$) flows from gas inlet port 411 to gas outlet port 412. The high temperatures within isolation tube 410 then lead to formation of an oxynitride layer on wafer 490 according to Equations 1 and 2 described previously.

Figure 2A:
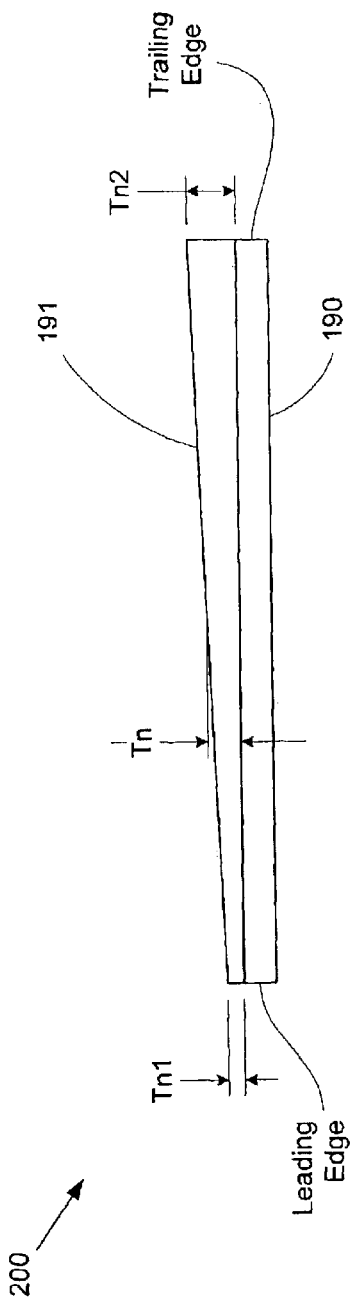
FIG. 2*a* is a schematic diagram of an oxynitride layer having a constant nitrogen concentration formed by a conventional RTN process.
Figure 2B:
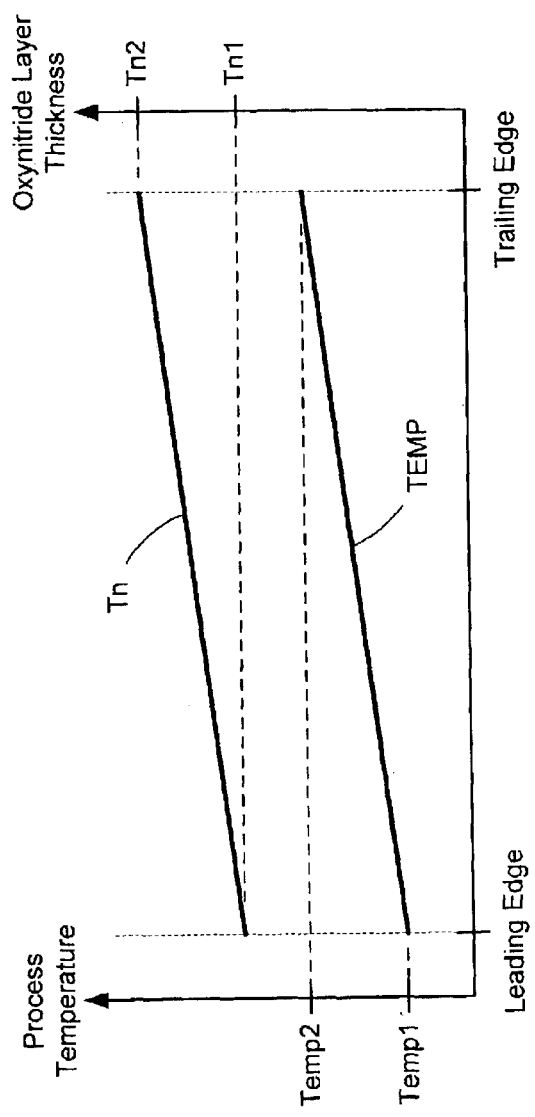
FIG. 2*b* is a graph comparing an RTN process chamber temperature profile and the resulting oxynitride layer thickness gradient.
Figure 3A:
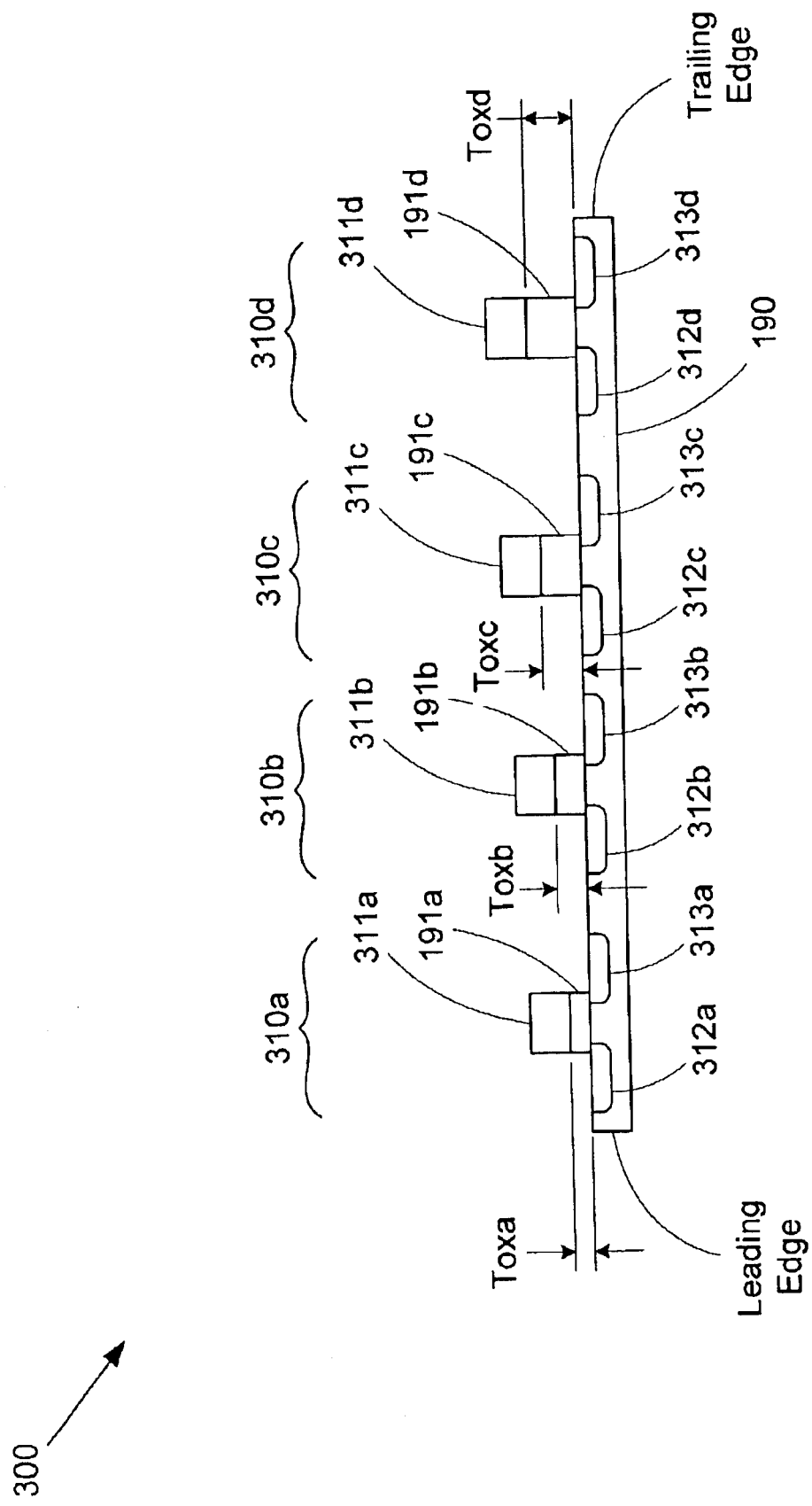
FIG. 3*a* is a schematic diagram of transistors on a processed wafer formed using a conventional oxynitride layer.
Figure 3B:
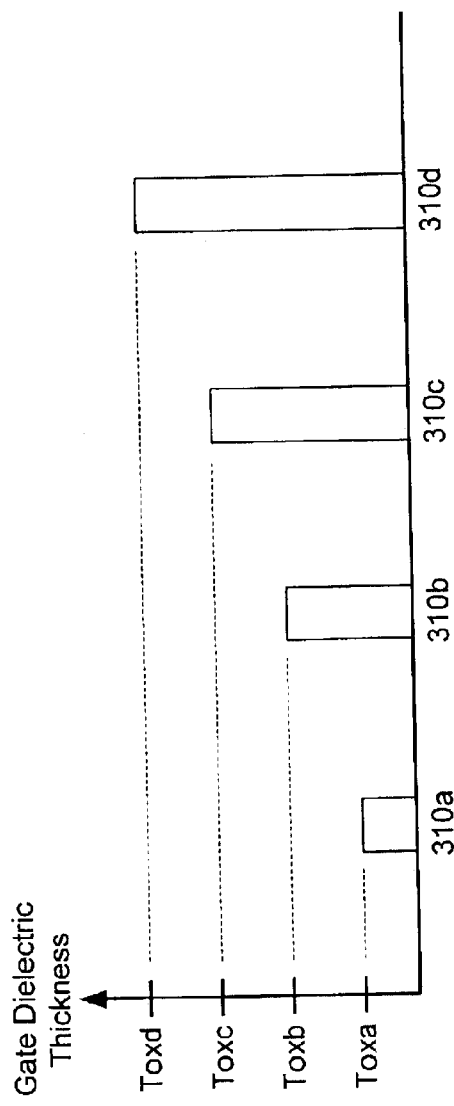
FIGS. 3*b* and 3*c* are graphs relating gate dielectric thickness and threshold voltage for the transistors of FIG. 3*a*.
Figure 3C:
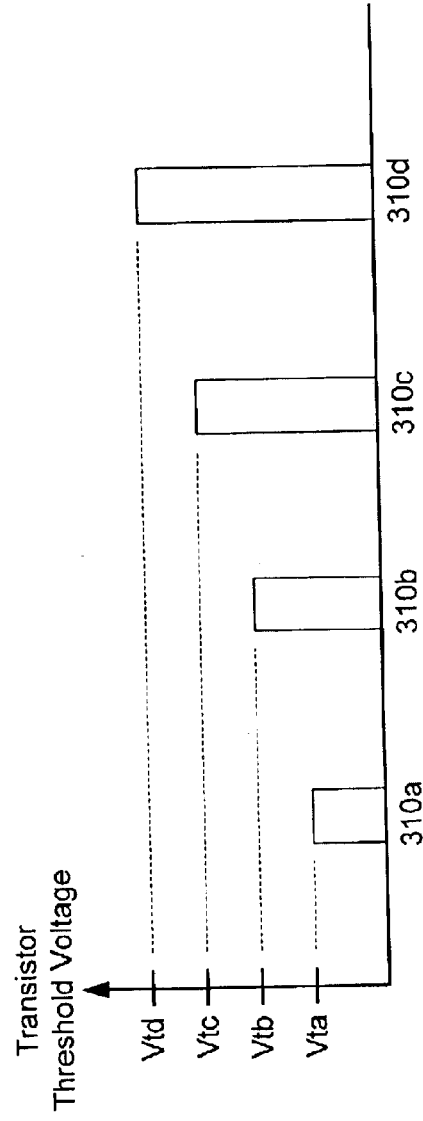
Figure 5A:
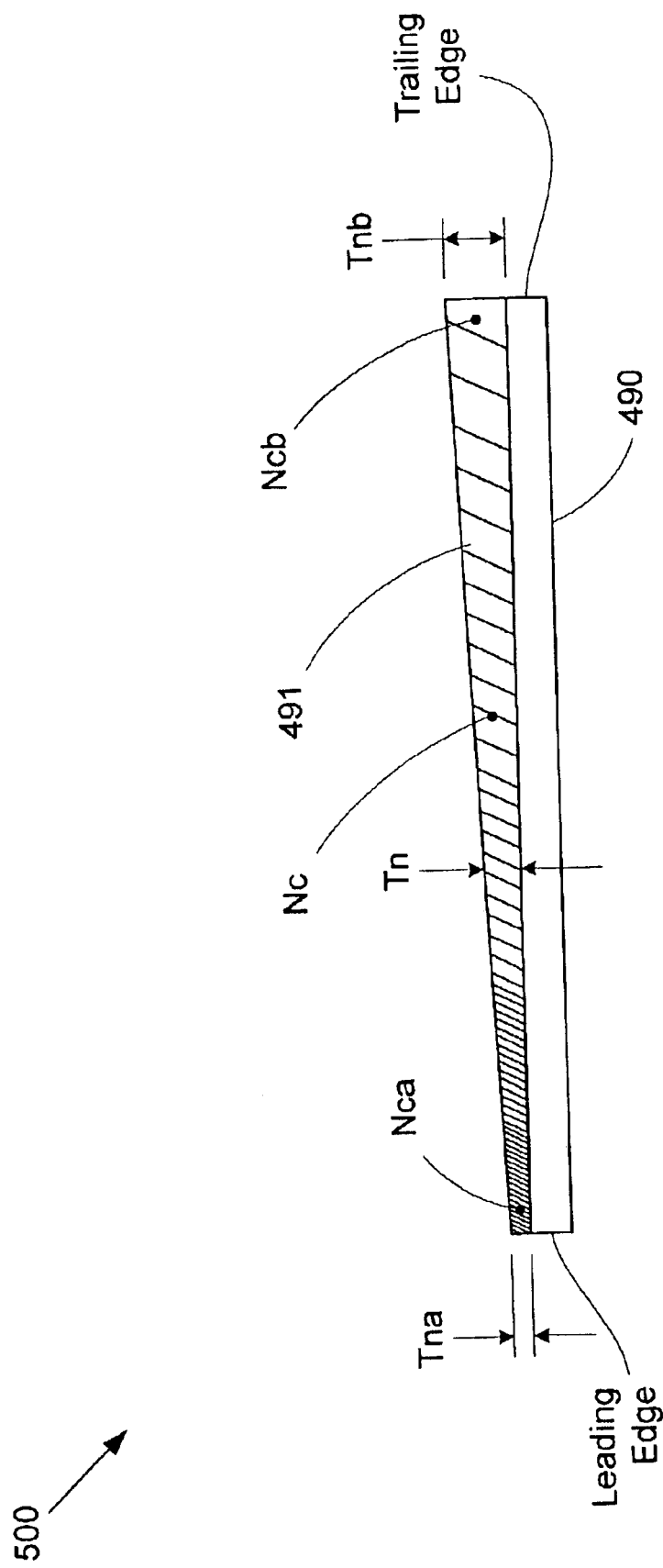
FIG. 5*a* is a schematic diagram of an oxynitride layer having a nitrogen concentration gradient formed by an RTN process in accordance with an embodiment of the invention.

FIG. 5a shows a processed wafer 500 that includes an oxynitride layer 491 formed on the surface of wafer 490 by RTN system 400. Because RTN process chamber 440 is substantially similar to conventional RTN process chambers (such as RTN process chamber 100 shown in FIG. 1), oxynitride layer 491 exhibits the same type of positive thickness gradient seen in oxynitride layer 191 shown in FIG. 2a, increasing from a minimum thickness Tna at the leading edge of wafer 490 to a maximum thickness Tnb at the trailing edge.

However, unlike in conventional oxynitride layers, the nitrogen concentration Nc within oxynitride layer 491 is not constant. The nitrogen concentration Nc within oxynitride layer 491 is roughly indicated by the spacing of the diagonal shading lines in FIG. 5a, wherein the closer the shading lines are located to one another, the higher the nitrogen concentration. PMOS compensation recipe Pcomp (provided by control system 450 as shown in FIG. 4) specifies RTN process parameters that cause the nitrogen concentration in oxynitride layer 491 to range from a maximum concentration Nca at the leading edge of wafer 490 to a minimum concentration Ncb at the trailing edge. Various techniques can be used to induce this "negative" nitrogen concentration gradient (i.e., decreasing from the leading edge of the wafer to the trailing edge). According to an embodiment of the invention, recipe Pcomp specifies an $N_2O$ gas flow profile that defines a flow rate (or rates) that are lower than conventional RTN recipe flow rates.

For example, a typical RTN process specifies a total process gas flow rates in the range of 4 to 5 liters/minute, with $N_2O$-to-$O_2$ ratios in the 3:1 to 4:1 range. In contrast, a 0.25 um PMOS (or CMOS) recipe in accordance with an embodiment of the invention could specify a reduced total process gas flow rate of approximately 3 liters/minute or less, with a correspondingly lowered $N_2O$-to-$O_2$ ratio of roughly 2:1 or 1:2 or even lower. These reduced flow rates can be applied in conjunction with standard RTN process temperatures (typically in the 980–1080° C. range) and standard RTN process intervals (typically 20–30 seconds per 50A of oxynitride layer growth) to produce a negative nitrogen concentration gradient in accordance with an embodiment of the invention.

For example, using the above process parameters, an oxynitride layer can be formed having a positive thickness gradient ranging from approximately 4.4–5.2 nm (Tna) at the leading edge of the wafer to approximately 5.5–6.5 nm (Tnb) at the trailing edge of the wafer, with a negative nitrogen concentration gradient that varies from roughly 1.5–3% (Nca) at the leading edge of the wafer down to roughly 0.5–1% (Ncb) at the trailing edge of the wafer (for an 8" wafer). An oxynitride layer having such characteristics can then be used to in the production of PMOS or CMOS devices having consistent PMOS threshold voltages across the wafer.

The mechanism by which these lowered gas flow rates create this negative nitrogen concentration is related to an atomic oxygen buildup in the process chamber. As described previously, high process temperatures are used in an RTN process to release atomic oxygen from the nitrous oxide that is flowed into the process chamber (as described with respect to Equation 1). Most of the oxygen radicals are then incorporated into nitric oxide molecules (Equation 2) that ultimately form the desired oxynitride layer on the wafer. However, a portion of the atomic oxygen is not consumed by the oxynitride layer formation reactions. If not quickly removed from the vicinity of the oxynitride layer, these excess oxygen radicals can react with and remove nitrogen from the oxynitride layer—i.e., decrease the nitrogen concentration. Therefore, conventional RTN processes provide a high enough process gas flow rate that most of those excess oxygen radicals are rapidly exhausted from the process chamber.

Figure 5B:
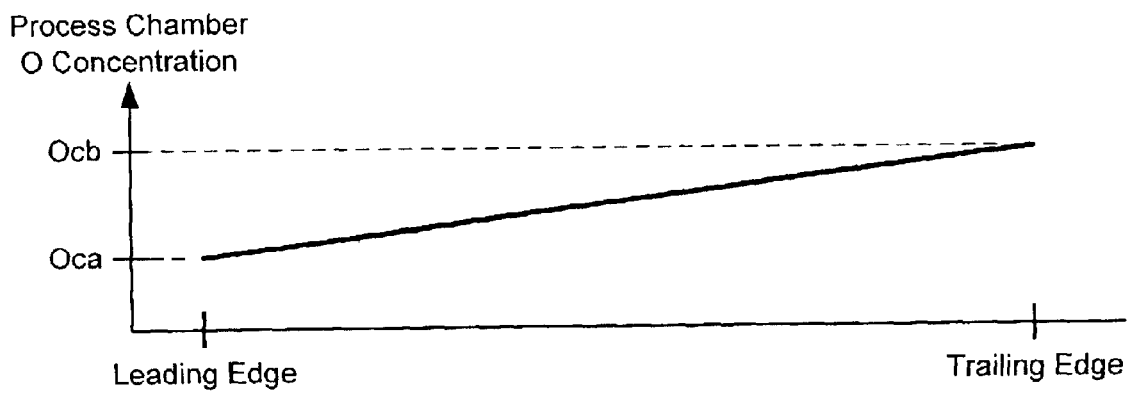
FIGS. 5*b*, 5*c*, and 5*d* are graphs comparing an RTN process chamber atomic oxygen concentration profile with the resulting oxynitride layer nitrogen concentration gradient and oxynitride layer thickness gradient.
Figure 5C:
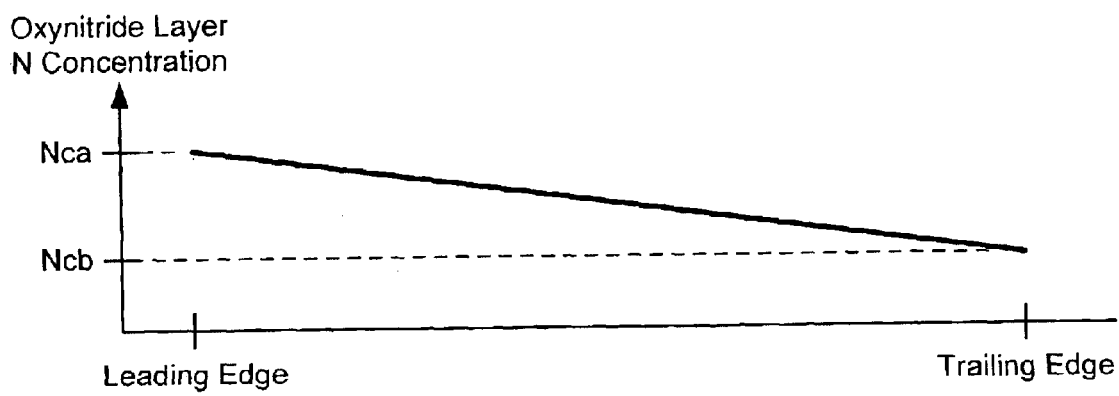
Figure 5D:
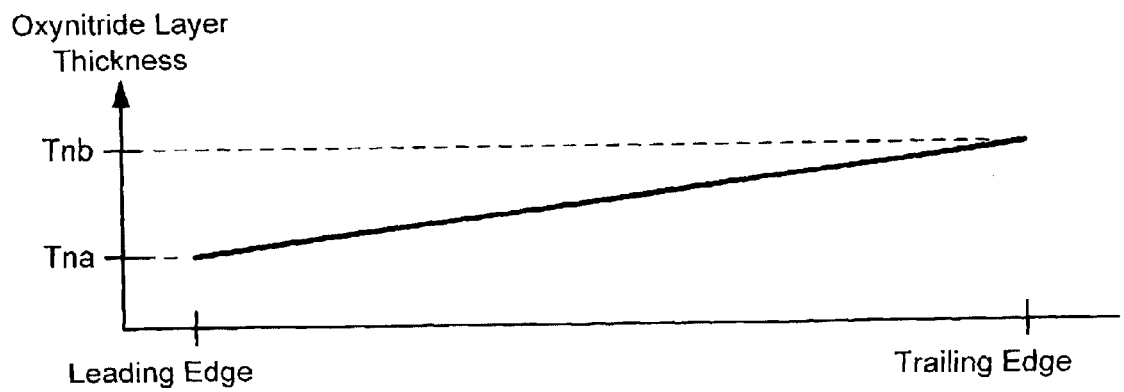

In contrast, the lowered process gas flow rate specified by recipe Pcomp allows an accumulation of atomic oxygen to develop in the process chamber. Furthermore, because excess oxygen radicals are being generated across the surface of wafer 490, the local concentration of atomic oxygen (i.e., the concentration of atomic oxygen radicals at a given location) increases in the direction of process gas flow. FIG. 5b provides a sample graph of this process chamber atomic oxygen (O) concentration created by recipe Pcomp. FIG. 5c is a corresponding graph of the resulting oxynitride layer nitrogen (N) concentration, while FIG. 5d is a corresponding graph of the resulting oxynitride layer thickness. As noted previously, the atomic oxygen concentration in the process chamber exhibits a positive gradient, with the atomic oxygen concentration in the vicinity of the leading edge of wafer 490 being less than the atomic oxygen concentration in the vicinity of the trailing edge. Accordingly, more incorporated nitrogen is removed from the portion of oxynitride layer 491 at the trailing edge of wafer 490 than from the portion of oxynitride layer 491 at the leading edge, as reflected by the negative gradient for the graph of oxynitride layer N concentration. The magnitude of this nitrogen concentration gradient can be controlled via the process gas flow rate(s) and duration(s) specified by recipe Pcomp. Meanwhile, because the heating conditions for the process chamber are the same as in conventional RTN process recipes, the graph of oxynitride layer thickness exhibits the same rising profile from the leading edge of wafer 490 to the trailing edge (positive gradient).

Figure 6A:
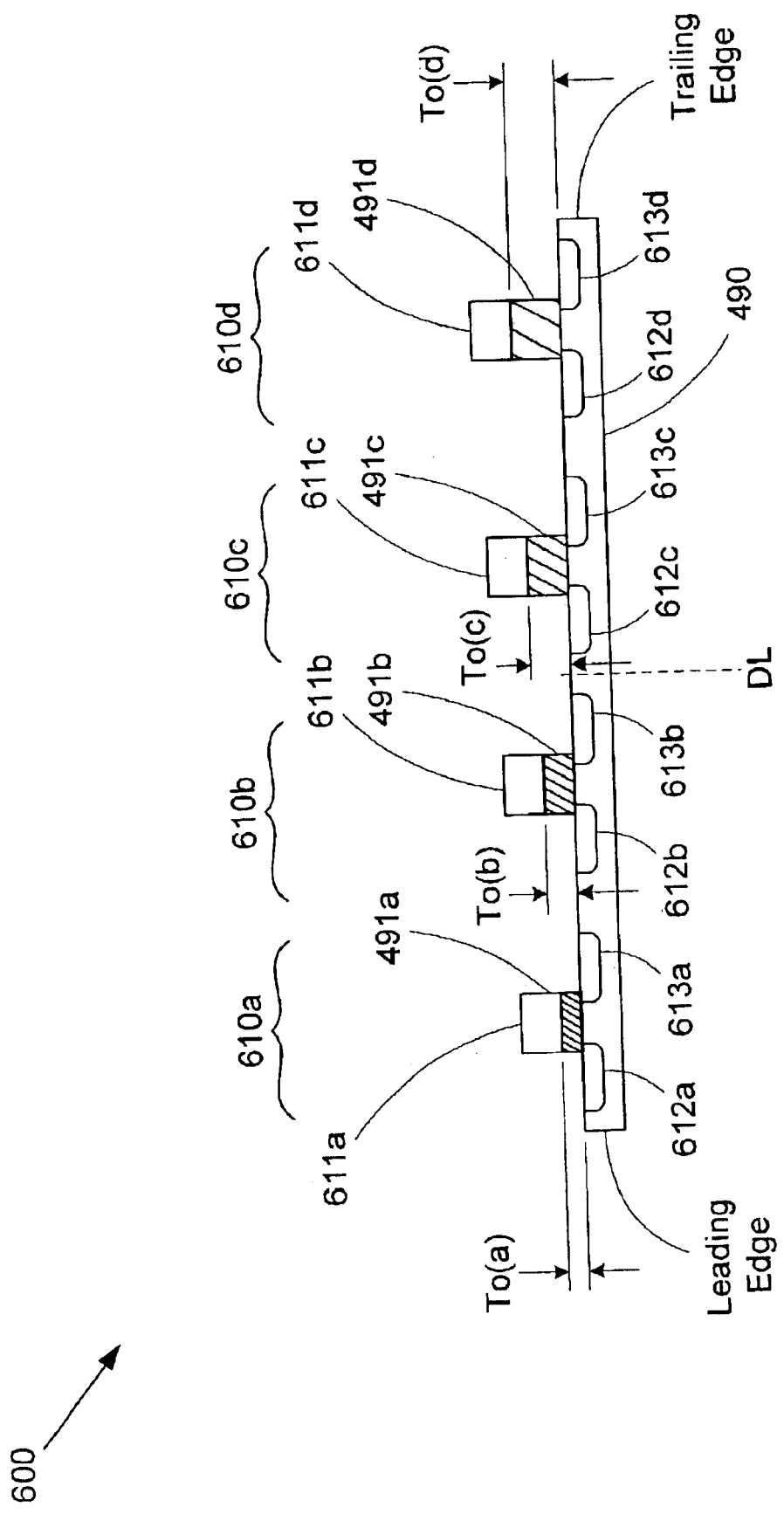
FIG. 6*a* is a schematic diagram of transistors on a processed wafer formed using an oxynitride layer in accordance with an embodiment of the invention.

FIG. 6a shows a processed wafer 600 formed from processed wafer 500 shown in FIG. 5a. Processed wafer 600 comprises PMOS transistors 610a, 610b, 610c, and 610d. Note that processed wafer 600 is shown with four transistors for explanatory purposes only, and a processed wafer formed according to the invention can include any number of transistors. Transistors 610a–610d include source regions 612a–612d, respectively, drain regions 613a–613d, respectively, gate dielectrics 491a–491d, respectively, and gates 611a–611d, respectively. Gate dielectrics 491a–491d have thicknesses To(a)–To(d), respectively. Because gate dielectrics 491a–491d are formed from oxynitride layer 491 shown in FIG. 5a, thicknesses To(a)–To(d) track the positive thickness gradient of oxynitride layer 491; i.e., transistor 610a, which is formed towards the leading edge of wafer 490, will have a gate dielectric thickness To(a) that is less than the gate dielectric thickness To(d) of transistor 610d, which is formed towards the trailing edge of wafer 490. At the same time, the nitrogen concentrations of gate dielectrics 491a–491d will likewise track the negative nitrogen concentration gradient of oxynitride layer 491; i.e., transistor 610a will have a gate dielectric nitrogen concentration that is greater than the gate dielectric nitrogen concentration of transistor 610d, as indicated by the different shading densities gate dielectrics 491a–491d. Note that if processed wafer 600 is diced into multiple ICs, the individual transistors in each of the ICs will exhibit the same type of gate dielectric thickness and nitrogen concentration gradients present in processed wafer 600. For instance, if processed wafer 600 is split into two ICs along an example dice line DL, the individual transistors in each of the two ICs will have increasing gate dielectric thicknesses and decreasing gate dielectric nitrogen concentrations in a single direction.

Gates 611a–611d comprise polysilicon doped with P-type dopant atoms (e.g., boron) to improve transistor performance. As noted previously, nitrogen in the gate dielectric of a transistor inhibits dopant penetration from the transistor gate into the channel region of the transistor. The greater the concentration of nitrogen in the gate dielectric, the greater the resistance to dopant penetration. Therefore, the transistors formed closer to the leading edge of wafer 490 will experience less dopant penetration than the transistors formed closer to the trailing edge of wafer 490. Recall also that the transistors formed closer to the trailing edge of wafer 490 have thicker gate dielectrics than those transistors formed closer to the leading edge of wafer 490. Therefore, the transistors having thicker gate dielectrics will experience greater dopant penetration than the transistors having thinner gate dielectrics. Because threshold voltage (magnitude) decreases with increased dopant penetration while threshold voltage (magnitude) increases with increased gate dielectric thickness, a properly sized nitrogen concentration gradient in oxynitride layer 491 shown in FIG. 5a can be used to counteract threshold voltage variations caused by the thickness gradient of oxynitride layer 491.

Figure 6B:
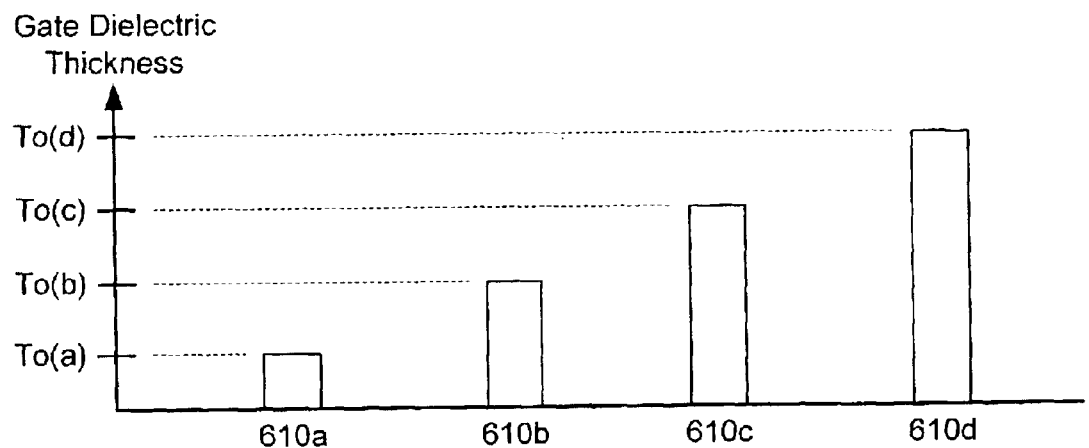
FIGS. 6*b*, 6*c*, and 6*d* are graphs relating gate dielectric thickness, gate dielectric nitrogen concentration, and the resulting transistor threshold voltage for the transistors of FIG. 6*a*, in accordance with an embodiment of the invention.
Figure 6C:
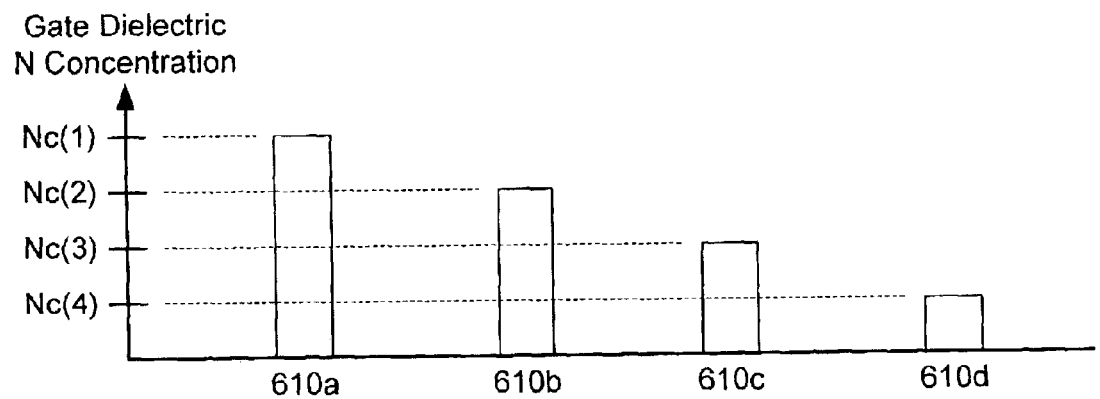
Figure 6D:

FIG. 6b provides a graph of gate dielectric thickness, while FIGS. 6c and 6d provide a corresponding graphs of gate dielectric nitrogen concentration and transistor threshold voltage, respectively, for PMOS transistors 610a–610d shown in FIG. 6a. As indicated in FIG. 6b, the gate dielectric thicknesses To(a)–To(d) of transistors 610a–610d, respectively, increase from the leading edge of wafer 490 to the trailing edge. Meanwhile, FIG. 6c shows nitrogen concentrations Nc(a)–Nc(d) of transistors 610a–610d, respectively, decreasing from the leading edge of wafer 490 to the trailing edge. As noted previously, the decreasing trend of nitrogen concentrations Nc(a)–Nc(d) leads to an increasing trend for dopant penetration that affects threshold voltage magnitude in a manner counter to the effects of the increasing gate dielectric thickness trend.

The results of these opposing effects are depicted in FIG. 6d, where transistors 610a–610d have threshold voltages that are substantially equal, despite their differing gate dielectric thicknesses. For example, using a recipe such as previously described recipe Pcomp, the threshold voltages for a 0.25 um PMOS process can be limited to a roughly 4% variation, despite the up to 25% variation in gate dielectric thickness. In this manner, the invention can reduce or substantially eliminate threshold voltage variations for PMOS transistors formed on the same wafer.

Although the present invention has been described in connection with several embodiments, it is understood that this invention is not limited to the embodiments disclosed, but is capable of various modifications that would be apparent to one of ordinary skill in the art. For example, according to other embodiments of the invention, nitric oxide (NO) or ammonia ($NH_3$) could be used instead of $N_2O$ (at similarly reduced flow rates) to create the desired negative nitrogen concentration gradient in an oxynitride layer. Thus, the invention is limited only by the following claims.

What is claimed is:

1. A method for processing a wafer, the method including performing a rapid thermal nitridation (RTN) operation, the RTN operation comprising:

heating the wafer in an RTN process chamber;

flowing process gases at a first flow rate across the wafer to form an oxynitride layer on the wafer, the process gases moving from a leading edge of the wafer to a trailing edge of the wafer, the oxynitride layer thickening from the leading edge of the wafer to the trailing edge of the wafer; and creating an accumulation of oxygen radicals in the process chamber, the accumulation of oxygen radicals increasing in local concentration from the leading edge of the wafer to the trailing edge of the wafer.

2. The method of claim 1, wherein the process gases comprise nitrous oxide gas and oxygen gas, the nitrous oxide gas having a second flow rate and the oxygen gas having a third flow rate, wherein creating the accumulation of oxygen radicals comprises maintaining the first flow rate at or below a process gas threshold flow rate and maintaining the second flow rate at or below a nitrous oxide threshold flow rate for a specified interval.

3. The method of claim 2, wherein the process gas threshold flow rate is about 3 liters/minute or less and the nitrous oxide threshold flow rate is about 2 liters/minute or less.

4. The method of claim 2, wherein the process gas threshold flow rate is about 3 liters/minute or less and the second flow rate is between approximately 1 liter/minute and 2 liters/minute.

5. The method of claim 1, further comprising forming a plurality of PMOS transistors on the wafer, each of the plurality of PMOS transistors comprising a doped gate positioned over a gate dielectric, the gate dielectric being formed from the oxynitride layer.

6. The method of claim 5, wherein the plurality of P-type metal-oxide-semiconductor (PMOS) transistors have substantially equal threshold voltages.

* * * * *